US007402861B2

United States Patent
Abbott et al.

(10) Patent No.: US 7,402,861 B2
(45) Date of Patent: Jul. 22, 2008

(54) MEMORY CELLS AND SELECT GATES OF NAND MEMORY ARRAYS

(75) Inventors: Todd R. Abbott, Boise, ID (US); Michael Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 11/215,902

(22) Filed: Aug. 31, 2005

(65) Prior Publication Data

US 2006/0006456 A1      Jan. 12, 2006

Related U.S. Application Data

(62) Division of application No. 10/878,799, filed on Jun. 28, 2004, now Pat. No. 7,348,236.

(51) Int. Cl.
*H01L 29/76* (2006.01)
(52) U.S. Cl. ...................... 257/314; 438/257
(58) Field of Classification Search ................ 257/314, 257/315, 319; 438/157, 195, 257
See application file for complete search history.

(56) References Cited

U.S. PATENT DOCUMENTS

| 5,618,742 | A | 4/1997 | Shone |
| 5,650,345 | A | 7/1997 | Ogura |
| 6,562,681 | B2 * | 5/2003 | Tuan et al. ................. 438/257 |
| 6,642,570 | B2 | 11/2003 | Tseng |
| 2001/0009289 | A1 | 7/2001 | Jeong |
| 2004/0178456 | A1 * | 9/2004 | Park et al. .................. 257/390 |

* cited by examiner

*Primary Examiner*—David Vu
(74) *Attorney, Agent, or Firm*—Leffert Jay & Polglaze, P.A.

(57) ABSTRACT

A select gate of a NAND memory array has a first dielectric layer formed on a semiconductor substrate. A first conductive layer is formed on the first dielectric layer. Conductive spacers are formed on sidewalls of the first conductive layer and are located between an upper surface of the first conductive layer and the first dielectric layer. A second dielectric layer overlies the first conductive layer and the conductive spacers. A second conductive layer is formed on the second dielectric layer. A third conducive layer is formed on the second conductive layer, passes though a portion of the second conductive layer and the second dielectric layer, and contacts the first conductive layer. The third conductive layer electrically connects the first and second conductive layers.

20 Claims, 7 Drawing Sheets

MEMORY CELLS AND SELECT GATES OF NAND MEMORY ARRAYS

CROSS-REFERENCE TO RELATED APPLICATION

This is a divisional application of application Ser. No. 10/878,799, titled "FORMATION OF MEMORY CELLS AND SELECT GATES OF NAND MEMORY ARRAYS," filed Jun. 28, 2004 now U.S. Pat. No. 7,348,236, which application is assigned to the assignee of the present invention and the entire contents of which are incorporated herein by reference.

TECHNICAL FIELD OF THE INVENTION

The present invention relates generally to memory devices and in particular the present invention relates to the formation of memory cells and select gates of NAND memory arrays.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. The rows and columns are usually formed using two separate masking steps. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word-select line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word-select line connected to a control gate of a memory cell. In addition, the word-select lines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

For reasons stated below which will become apparent to those skilled in the art upon reading and understanding the present specification, there is a need in the art for alternatives for forming NAND memory devices.

SUMMARY

For one embodiment, the invention provides a select gate of a NAND memory array having a first dielectric layer formed on a semiconductor substrate. A first conductive layer is formed on the first dielectric layer. Conductive spacers are formed on sidewalls of the first conductive layer and are located between an upper surface of the first conductive layer and the first dielectric layer. A second dielectric layer overlies the first conductive layer and the conductive spacers. A second conductive layer is formed on the second dielectric layer. A third conducive layer is formed on the second conductive layer, passes though a portion of the second conductive layer and the second dielectric layer, and contacts the first conductive layer. The third conductive layer electrically connects the first and second conductive layers.

Further embodiments of the invention include methods and apparatus of varying scope.

DETAILED DESCRIPTION

Figure 1:
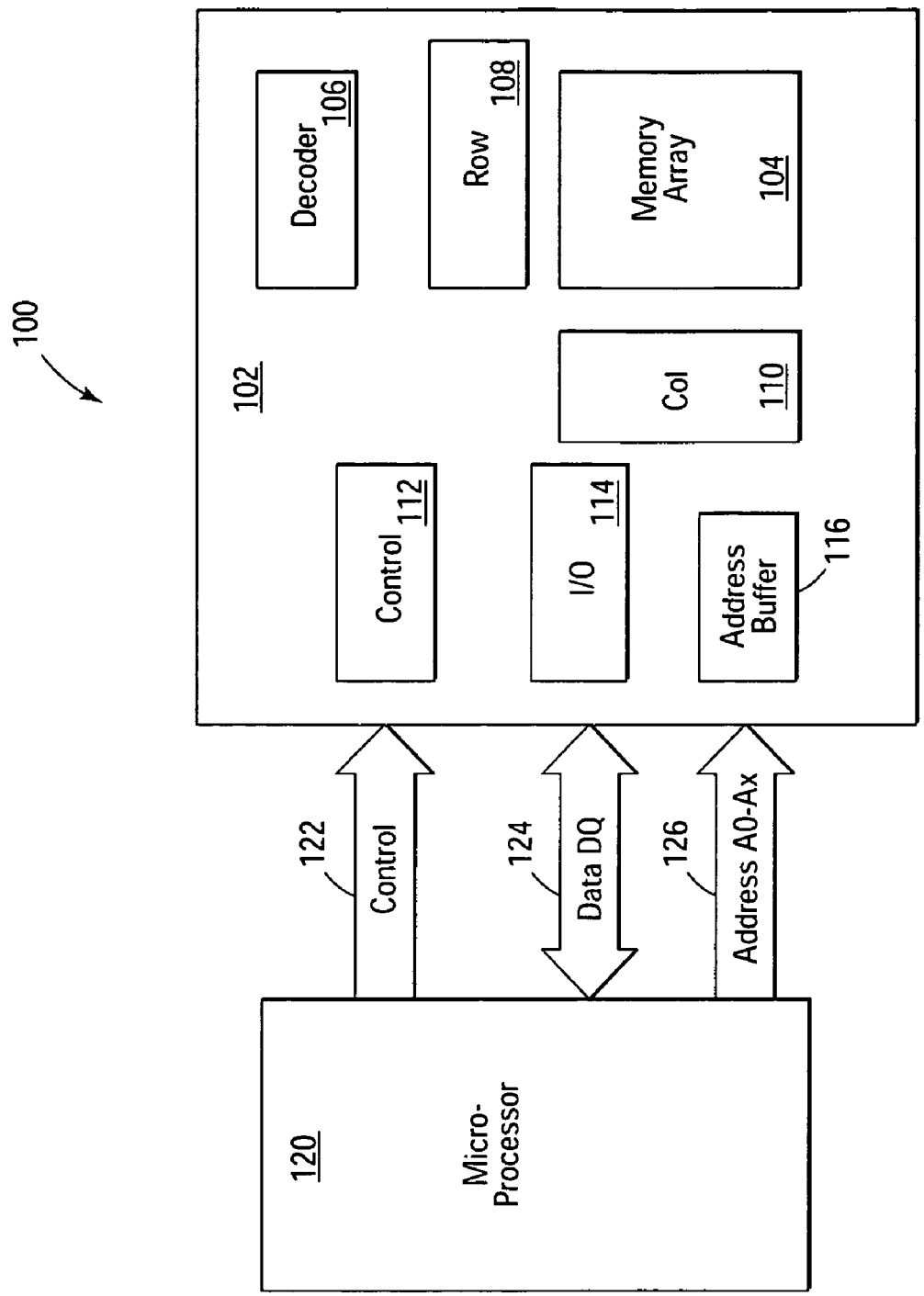
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit flash memory device 102, e.g., a NAND memory device, that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
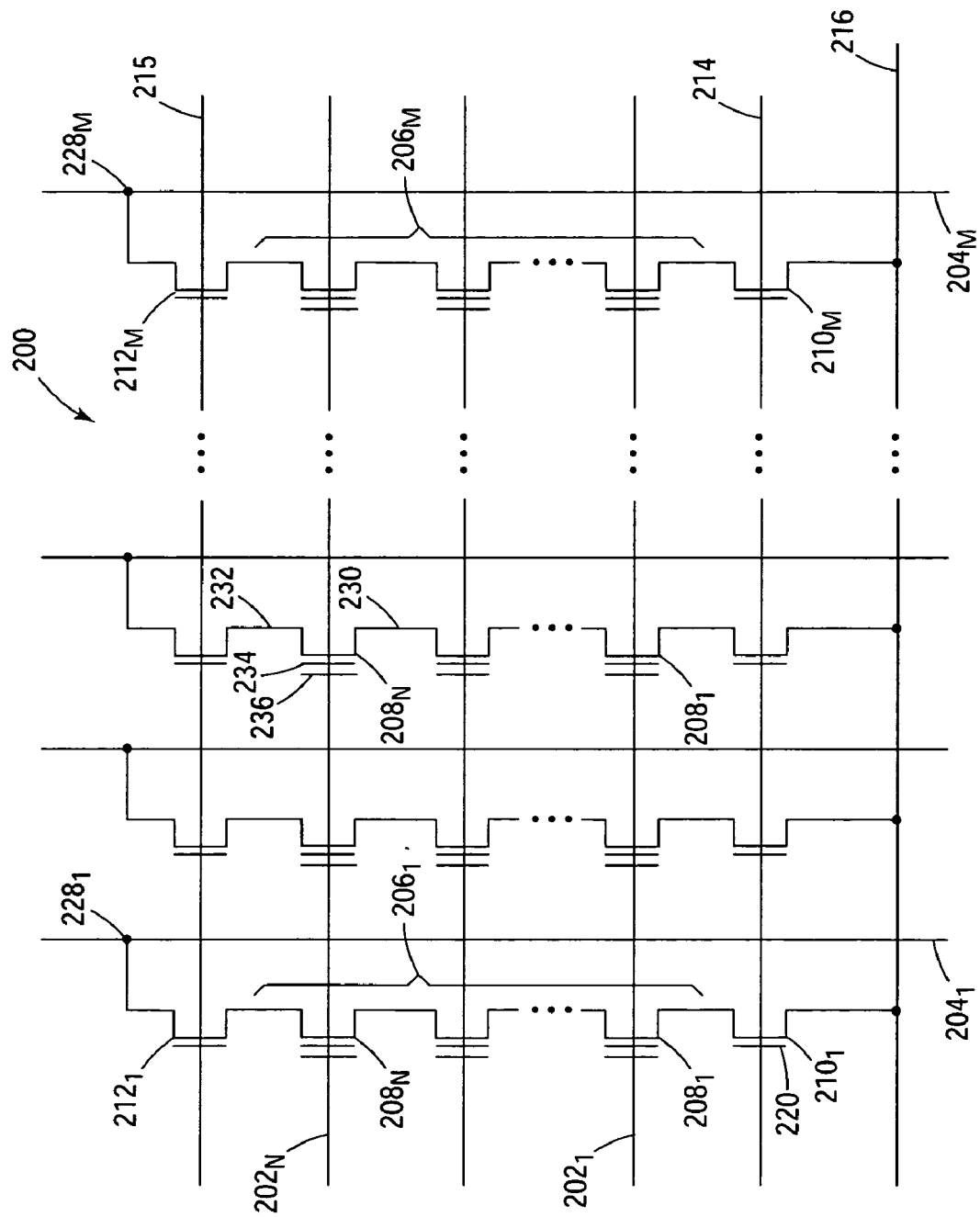
FIG. 2 is a schematic of a NAND memory array, according to another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor 208, of the corresponding NAND string $206_1$. Each source select gate 210 includes a control gate 220.

The drain of each drain select gate 212 is connected to the local bit line 204 for the corresponding NAND string at a drain contact 228. For example, the drain of drain select gate $212_1$ is connected to the local bit line $204_1$ for the corresponding NAND string 206, at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3A:
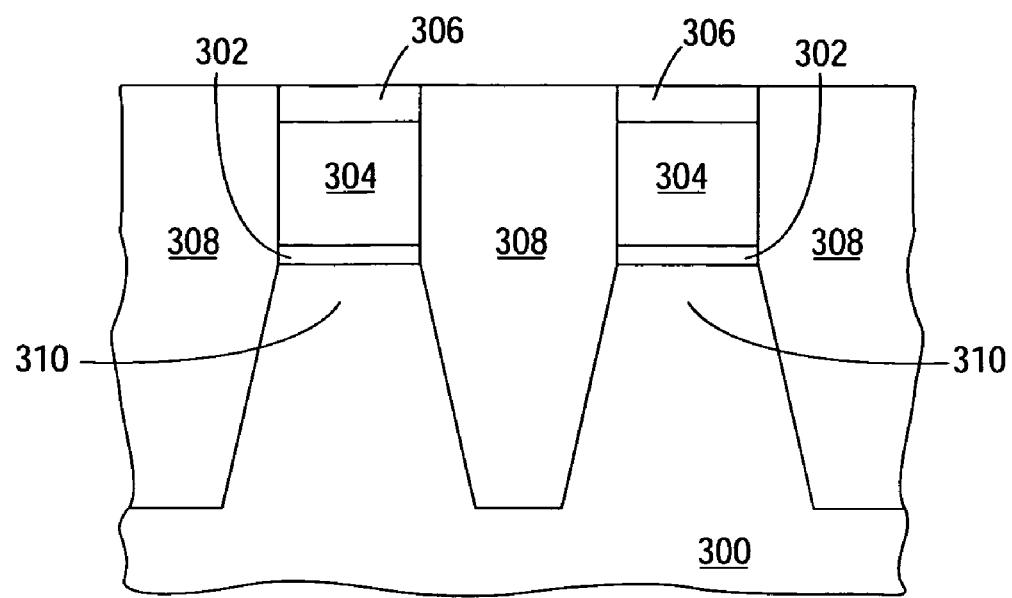
FIGS. 3A-3E are cross-sectional views of a portion of a memory array during various stages of fabrication, according to another embodiment of the invention.

FIGS. 3A-3E are cross-sectional views of a portion of a memory array, such as a portion of the memory array 200 of FIG. 2, during various stages of fabrication, according to another embodiment of the invention. FIG. 3A depicts the portion of the memory device after several processing steps have occurred. Formation of the structure depicted in FIG. 3A is well known and will not be detailed herein.

In general, for one embodiment, the structure of FIG. 3A is formed by forming a first dielectric layer 302, e.g., an oxide layer, on a semiconductor substrate 300 that is of monocrystalline silicon or the like. A first conductive layer 304, such as a layer of doped polysilicon, is formed on the first dielectric layer 302, and a hard mask layer 306 is formed on the first conductive layer. The hard mask layer 306 can be a second dielectric layer, such as a nitride layer, e.g., a silicon nitride ($Si_3N_4$) layer.

Isolation regions 308, such as shallow trench isolation (STI) regions, are then formed by patterning the hard mask layer 306 and etching trenches through the hard mask layer 306, the first conductive layer 304, and the first dielectric layer 302 and into substrate 300. This defines active regions 310 underlying the first dielectric layer 302. A suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc., is deposited in the trenches and overlying the hard mask layer 306, such as by blanket deposition, to form isolation regions 308 between the active regions 310. The dielectric material is then removed from the hard mask layer 306, e.g., using chemical mechanical polishing (CMP), so that an upper surface of the isolation regions 308 is substantially flush with an upper surface of the hard mask layer 306, thereby producing the structure of FIG. 3A.

Figure 3B:
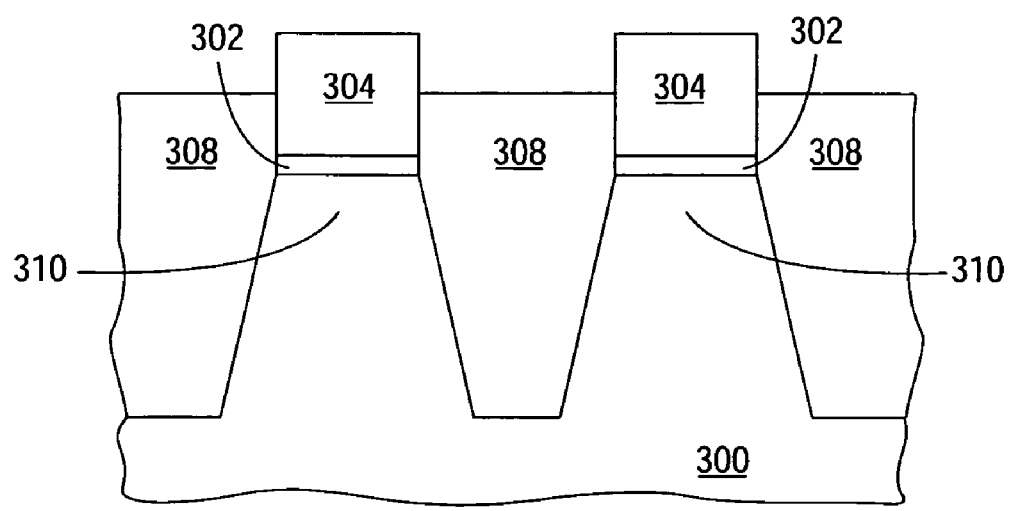

In FIG. 3B, the hard mask layer 306 is removed exposing an upper surface of the first conductive layer 304 of each of the active regions 310, and the isolation regions 308 may be recessed so that their upper surfaces lie below the upper surface of the first conductive layer 304 of each of the active regions 310. This can be accomplished by etching.

Figure 3C:
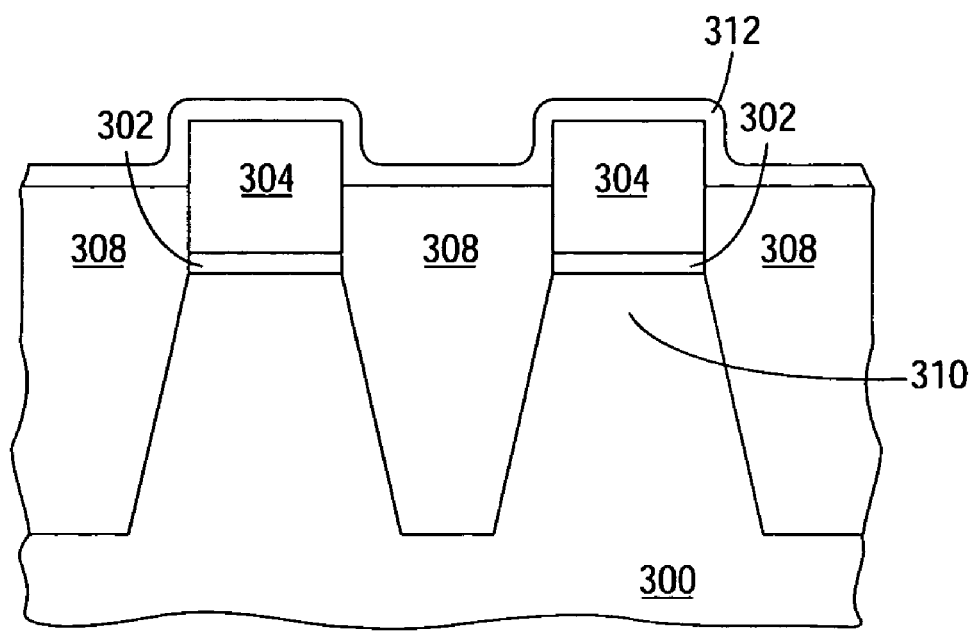

A second conductive layer 312, e.g., of doped polysilicon, is formed overlying the isolation regions 308 and the first conductive layer 304, such as by blanket deposition, in FIG. 3C. Portions of the second conductive layer 312 are then anisotropically removed such that remaining portions of the second conductive layer 312 self align with and form conductive spacers on sidewalls of the first conductive layer 304. For one embodiment, this is accomplished using an anisotropic etching process that selectively removes horizontal portions of the second conductive layer 312.

Figure 3D:
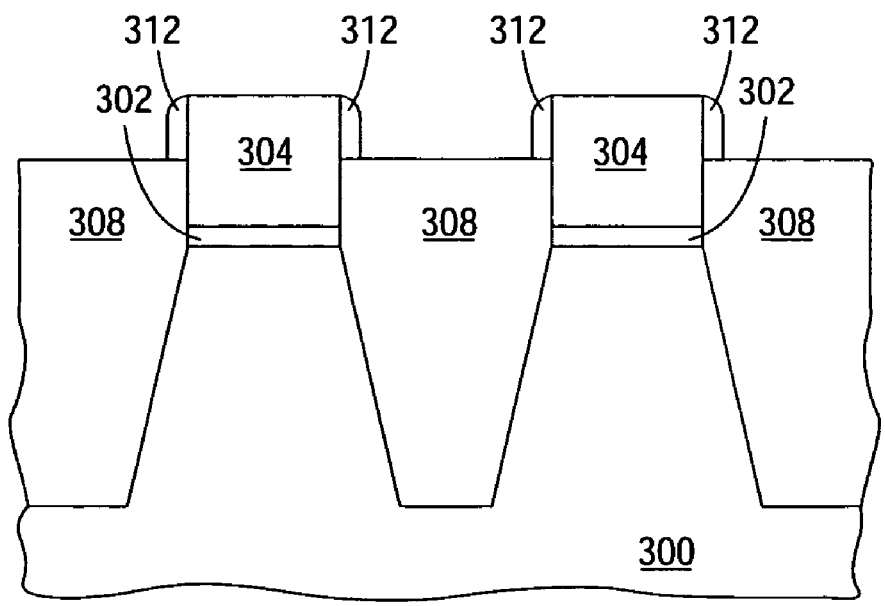

Note that the conductive spacers formed from conductive layer 312 are located between the upper surface of the first conductive layer 304 of the active regions 310 and the first dielectric layer 302. Specifically, the conductive spacers extend from the upper surface of the first conductive layer 304 to the upper surfaces of the isolation regions 308, as shown in FIG. 3D. The conductive spacers increase the surface area of conductive layer 304. As discussed below, the first conductive layer 304 with the conductive spacers thereon will form floating gates of floating gate memory cells. The increased surface area due to the conductive spacers on the sidewalls acts to increase the coupling of the floating gate. Methods in accordance with the invention facilitate increased coupling area without the use of an additional patterning step.

Figure 3E:
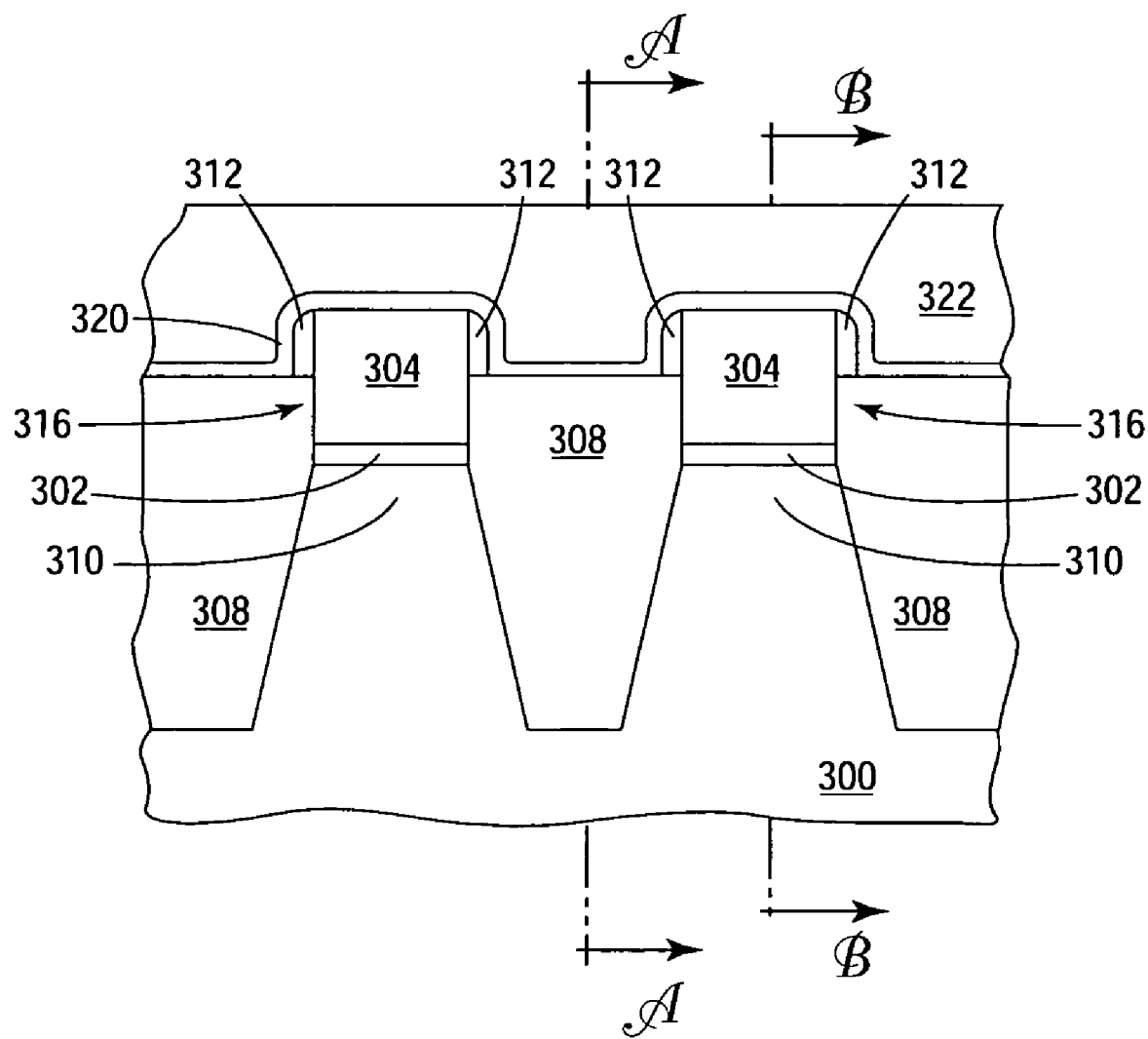

A third dielectric layer 320 is formed overlying isolation regions 308 and the first conductive layer 304 and the second conductive layer 312 in FIG. 3E. The third dielectric layer 320 can be a layer of silicon oxide, nitride, oxynitride, oxide-nitride-oxide (ONO), or other dielectric material. A third conductive layer 322, e.g., of doped polysilicon, is formed on the third dielectric layer 320 in FIG. 3E. The first conductive layer 304, the second conductive layer 312, third dielectric layer 320, and the third conductive layer 322 form gate stacks 316 of FIG. 3E. Portions of the gate stacks 316 will form a part of floating gate memory cells, where the first dielectric layer 302 forms a tunnel dielectric layer, the first conductive layer 304 and the second conductive layer 312 form a floating gate, the third dielectric layer 320 is an intergate dielectric layer, and the third conductive layer 322 forms a control gate (or word line).

Figure 4A:
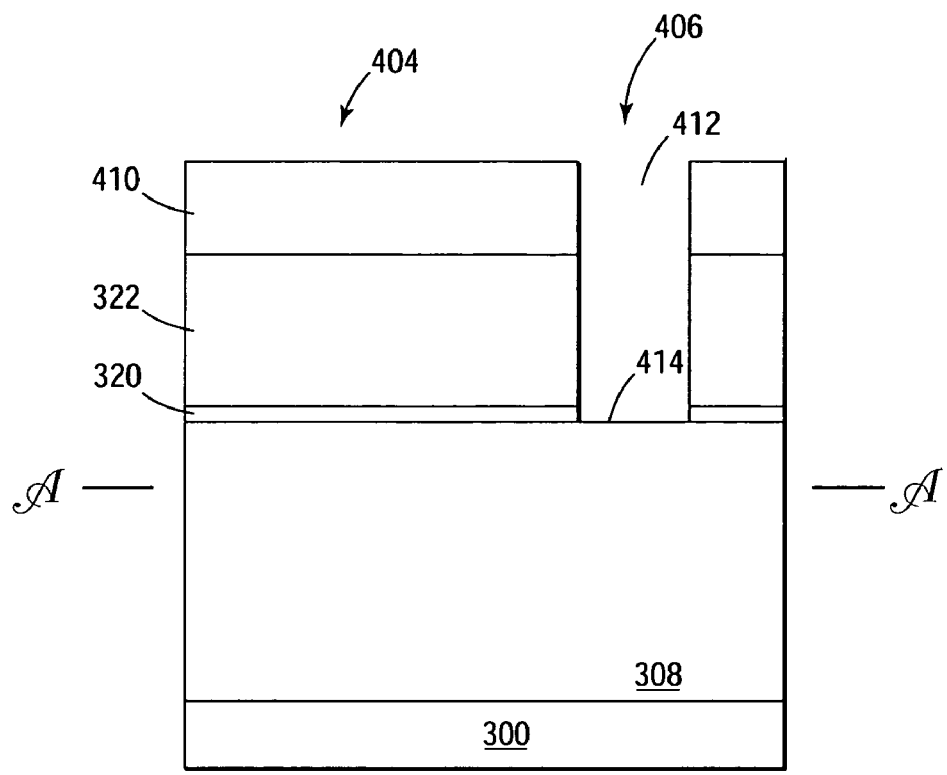
FIGS. 4A and 4B are views respectively taken along line A-A and line B-B of FIG. 3E at another stage of fabrication, according to another embodiment of the invention.
Figure 4B:
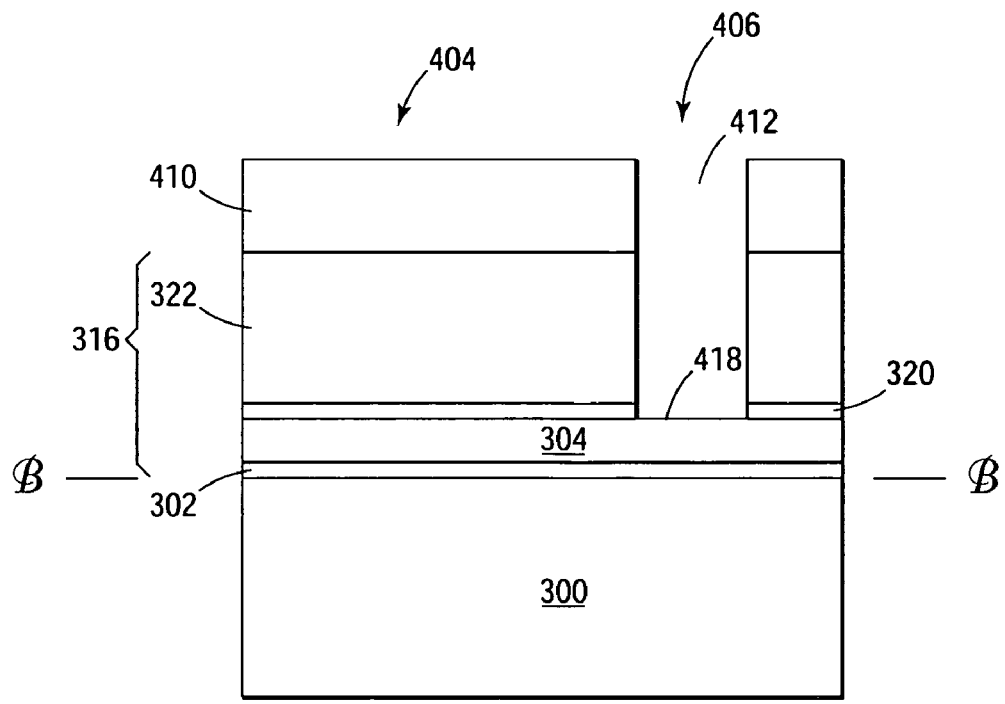

FIGS. 4A and 4B are views respectively taken along line A-A and line B-B of FIG. 3E at another stage of fabrication, according to another embodiment of the invention. FIG. 4A is a view of a fill region between successive gate stacks 316 of FIG. 3E, and FIG. 4B is a view of a gate stack 316. FIGS. 4A and 4B illustrate that the portion of the memory array includes a memory cell portion 404 and a select gate portion 406.

A mask layer 410 is formed on the third conductive 322 in FIGS. 4A and 4B and is patterned for respectively exposing portions of the third conductive layer 322 and of the underlying third dielectric layer 320 within the select gate portion 406 for removal. As one example, the mask layer 410 is a patterned photoresist layer as is commonly used in semiconductor fabrication. The exposed portions of the third conductive layer 322 and the third dielectric layer 320 are then removed in FIGS. 4A and 4B, such as by etching. The removal process forms a slot 412 through the third conductive layer 322 and the third dielectric layer 320 that exposes a portion 414 of an isolation region 308 in FIG. 4A and a portion 418 of the first conductive layer 304 in FIG. 4B.

Figure 5A:
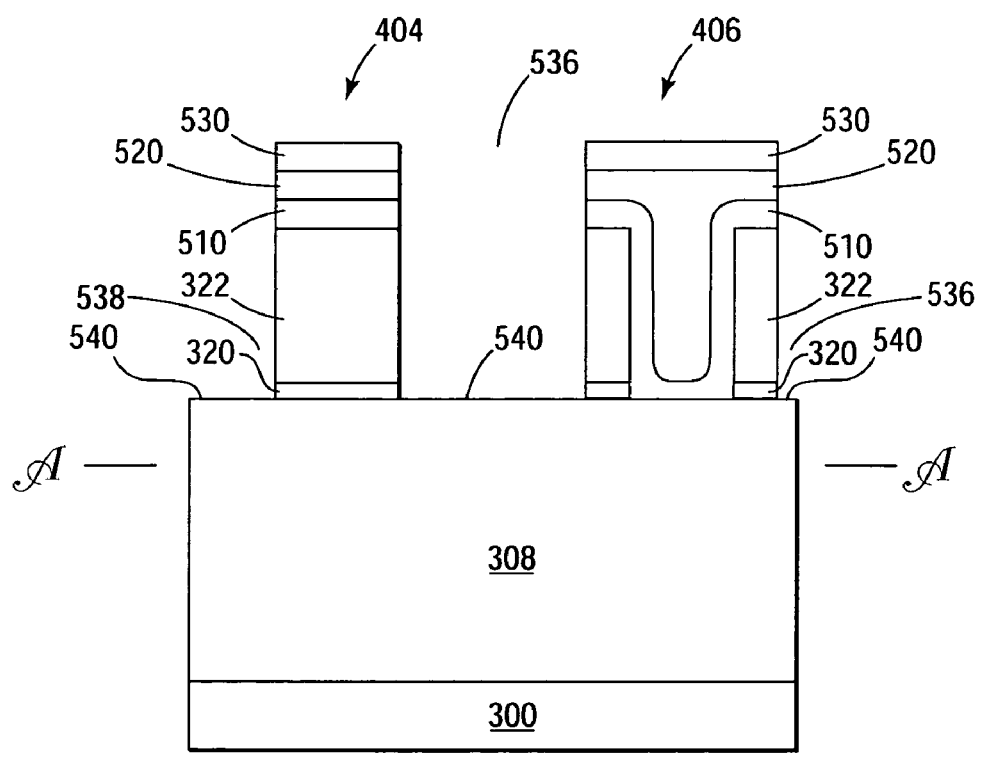
FIGS. 5A and 5B are views respectively taken along line A-A and line B-B of FIG. 3E at yet another stage of fabrication, according to yet another embodiment of the invention.
Figure 5B:
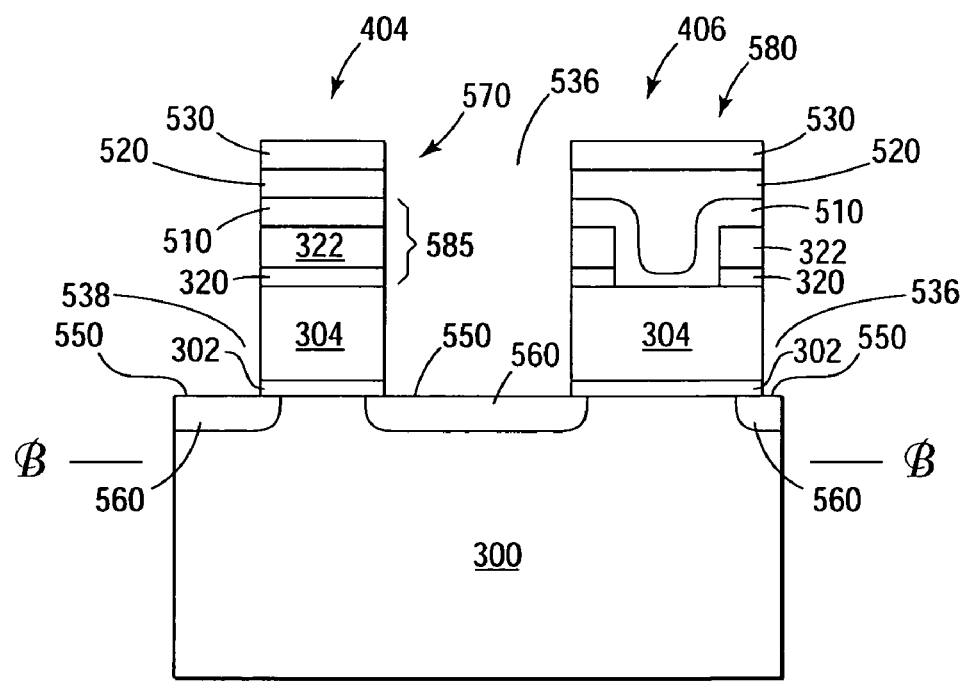

FIGS. 5A and 5B are views respectively taken along line A-A and line B-B of FIG. 3E at yet another stage of fabrication, according to yet another embodiment of the invention. The mask layer 410 is removed from the structure of FIGS. 4A and 4B. A fourth conductive layer 510 is formed overlying the third conductive layer 322, the exposed portion 414 of the of the isolation region 308 of FIG. 4A, and the exposed portion 418 of the first conductive layer 304 of FIG. 4B, as shown in FIGS. 5A and 5B. Note that the fourth conductive layer 510 is formed on sidewalls of the slot 412 of FIGS. 4A and 4B and thus lines the slot 412. The fourth conductive layer 510 can be a metal layer, such as a refractory metal layer, or a metal-containing layer, such as a refractory metal silicide layer, as well as any other conductive material. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. For one embodiment, a protective cap layer 520, such as TEOS (tetraethylorthosilicate), is formed overlying the fourth conductive layer 510, as shown in FIGS. 5A and 5B.

A mask layer 530, e.g., a photoresist layer, is formed on the cap layer 520 in FIGS. 5A and 5B and is patterned for respectively exposing portions of the cap layer 520, the underlying fourth conductive layer 510, the underlying third conductive layer 322, and the underlying third dielectric layer 320 in FIG. 5A for removal and respectively exposing portions of the cap layer 520, the underlying fourth conductive layer 510, the underlying third conductive layer 322, the underlying third dielectric layer 320, the underlying first conductive layer 304, and the underlying first dielectric layer 302 in FIG. 5B for removal. The removal process forms slots 536 and one or more slots 538 through the cap layer 520, the fourth conductive layer 510, the third conductive layer 322, and the third dielectric layer 320 that expose portions 540 of the isolation region 308, as shown in FIG. 5A. Slots 536 and the one or more slots 538 also pass through the cap layer 520, the fourth conductive layer 510, the third conductive layer 322, the third dielectric layer 320, the first conductive layer 304, and the first dielectric layer 302 to expose portions 550 of the substrate 300, as shown in FIG. 5B. Exposing portions 550 of the substrate 300 facilitates the formation of source/drain regions 560, as shown in FIG. 5B. The removal process separates the memory cell portion 404 the select gate portion 406, as shown in FIGS. 5A and 5B. That is, a slot 536 separates the memory cell portion 404 from the select gate portion 406. For one embodiment, etching accomplishes the removal process. The mask layer 530 is subsequently removed from the remaining portions of the cap layer 520.

Note that the portion of the memory array shown in FIG. 5B includes a floating-gate memory cell (or floating-gate field-effect transistor) 570 in its memory cell portion 404 and a select gate (or field-effect transistor) 580, such as a source select gate or a drain select gate, in its select gate portion 406. For one embodiment, the floating-gate memory cell 570 and the select gate 580 share a source drain region 560. Also note that a slot 536 separates floating-gate memory cell 570 from select gate 580. Although not shown, each of the one or more slots 538 separate successive memory cells 570 in the memory cell portion 404 of the memory array.

The floating-gate memory cell 570 includes the first dielectric layer 302 formed on the substrate 300 that acts as a tunnel dielectric layer, the first conductive layer 304 formed on the first dielectric layer 302 that, including the conductive spacers, acts as a floating gate layer, the third dielectric layer 320 formed on the first conductive layer 304 that acts as an intergate dielectric layer, the third conductive layer 322 formed on the third dielectric layer 320, and the fourth conductive layer 510 formed on the third conductive layer 322. The third conductive layer 322 and the fourth conductive layer 510 form a control gate (or word line) 585 of the floating-gate memory cell 570. For other embodiments, the control gate 585 may be a single conductive layer of one or more conductive materials or three or more conductive layers.

The select gate 580 of FIG. 5B includes the first dielectric layer 302 formed on the substrate 300 that acts as a gate dielectric layer, the first conductive layer 304 formed on the first dielectric layer 302, the third dielectric layer 320 formed on the first conductive layer 304, the third conductive layer 322 formed on the third dielectric layer 320, and the fourth conductive layer 510 formed on the third conductive layer 322. The fourth conductive layer 510 acts as a contact that passes through a portion of the third conductive layer 322 and through a portion of the third dielectric layer 320 and contacts a portion of the first conductive layer 304 to electrically connect the third conductive layer 322 to the first conductive layer 304. The electrically connected first conductive layer 304, with the conductive spacers thereon, third conductive layer 322, and fourth conductive layer 510 form a control gate of the select gate 580.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A select gate of a NAND memory array, comprising:
   a first dielectric layer formed on a semiconductor substrate;
   a first conductive layer formed on the first dielectric layer;
   conductive spacers formed on sidewalls of the first conductive layer and located between an upper surface of the first conductive layer and the first dielectric layer;
   a second dielectric layer overlying the first conductive layer and the conductive spacers;
   a second conductive layer formed on the second dielectric layer; and
   a third conductive layer formed on the second conductive layer, passing though a portion of the second conductive layer and the second dielectric layer so that a portion of the third conductive layer contacts the first conductive layer, the third conductive layer electrically connecting the first and second conductive layers, wherein the portion of the third conductive layer that contacts the first conductive layer is interposed between first and second portions of the second dielectric layer of the select gate.

2. The select gate of claim 1, wherein the third conductive layer is a metal-containing layer.

3. The select gate of claim 2, wherein the metal-containing layer comprises a material selected from the group consisting of refractory metals and refractory metal silicides.

4. The select gate of claim 2, wherein the first conductive layer, the conductive spacers, and the second conductive layer are of polysilicon.

5. The select gate of claim 1, wherein the conductive spacers respectively extend from the upper surface of the first conductive layer to isolation regions disposed on either side of the select gate.

6. The select gate of claim 1, further comprising a cap layer overlying the third conductive layer.

7. The select gate of claim 6, wherein the cap layer is a layer of tetraethylorthosilicate.

8. A NAND memory array comprising:
   a plurality of rows of memory cells; and
   a plurality of columns of NAND strings of memory cells, each NAND string selectively connected to a bit line through a select gate of the respective column, the select gates of the respective columns and each of the memory cells comprising:
   a first dielectric layer formed on a semiconductor substrate of the memory array;
   a first conductive layer formed on the first dielectric layer;
   conductive spacers formed on sidewalls of the first conductive layer and located between an upper surface of the first conductive layer and the first dielectric layer;
   a second dielectric layer overlying the first conductive layer and the conductive spacers;
   a second conductive layer formed on the second dielectric layer; and
   a third conducive layer formed on the second conductive layer;
   wherein the third conductive layer of the select gate passes though a portion of the second conductive layer and the second dielectric layer of the select gate so that a portion of the third conductive layer of the select gate contacts the first conductive layer of the select gate, the third conductive layer of the select gate electrically connecting the first and second conductive layers of the select gate, wherein the portion of the third conductive layer of the select gate that contacts the first conductive layer of the select gate is interposed between first and second portions of the second dielectric layer of the select gate.

9. The NAND memory array of claim 8, wherein the third conductive layer is a metal-containing layer.

10. The NAND memory array of claim 8, wherein the first conductive layer, the conductive spacers, and the second conductive layer are of polysilicon.

11. A NAND memory array comprising:
    a plurality of rows of memory cells; and
    a plurality of columns of NAND strings of memory cells, each NAND string selectively connected to a bit line through a drain select gate of the respective column and selectively connected to a source line through a source select gate of the respective column, the drain and source select gates of the respective columns and each of the memory cells comprising:
    a first dielectric layer formed on a semiconductor substrate of the memory array;
    a first conductive layer formed on the first dielectric layer;
    conductive spacers formed on sidewalls of the first conductive layer and located between an upper surface of the first conductive layer and the first dielectric layer;
    a second dielectric layer overlying the first conductive layer and the conductive spacers;
    a second conductive layer formed on the second dielectric layer; and
    a third conducive layer formed on the second conductive layer;
    wherein the third conductive layer of each of the drain and source select gates passes though a portion of the second conductive layer and the second dielectric layer of that select gate so that a portion of the third conductive layer of that select gate contacts the first conductive layer of that select gate, the third conductive layer of that select gate electrically connecting the first and second conductive layers of that select gate, wherein the portion of the third conductive layer of that select gate that contacts the first conductive layer of that select gate is interposed between first and second portions of the second dielectric layer of that select gate.

12. The NAND memory array of claim 11, wherein the third conductive layer is a metal-containing layer.

13. The select gate of claim 12, wherein the metal-containing layer comprises a material selected from the group consisting of refractory metals and refractory metal silicides.

14. The NAND memory array of claim 12, wherein the first conductive layer, the conductive spacers, and the second conductive layer are of polysilicon.

15. A memory device comprising:
a memory array comprising:
a plurality of rows of memory cells, each row connected to a word line; and
a plurality of columns of NAND strings of memory cells, each NAND string selectively connected to a bit line through a select gate of the respective column, the select gates of the respective columns and each of the memory cells comprising:
a first dielectric layer formed on a semiconductor substrate of the memory device;
a first conductive layer formed on the first dielectric layer;
conductive spacers formed on sidewalls of the first conductive layer and located between an upper surface of the first conductive layer and the first dielectric layer;
a second dielectric layer overlying the first conductive layer and the conductive spacers;
a second conductive layer formed on the second dielectric layer; and
a third conducive layer formed on the second conductive layer;
wherein the third conductive layer of the select gate passes though a portion of the second conductive layer and the second dielectric layer of the select gate so that a portion of the third conductive layer of the select gate contacts the first conductive layer of the select gate, the third conductive layer of the select gate electrically connecting the first and second conductive layers of the select gates, wherein the portion of the third conductive layer of the select gate that contacts the first conductive layer of the select gate is interposed between first and second portions of the second dielectric layer of the select gate;
column access circuitry connected to the bit lines; and
row access circuitry connected to the word lines.

16. The memory device of claim 15, wherein the third conductive layer is a metal-containing layer.

17. The memory device of claim 15, wherein the first conductive layer, the conductive spacers, and the second conductive layer are of polysilicon.

18. A memory device comprising:
a memory array comprising:
a plurality of rows of memory cells, each row connected to a word line; and
a plurality of columns of NAND strings of memory cells, each NAND string selectively connected to a bit line through a drain select gate of the respective column and selectively connected to a source line through a source select gate of the respective column, the drain and source select gates of the respective columns and each of the memory cells comprising:
a first dielectric layer formed on a semiconductor substrate of the memory device;
a first conductive layer formed on the first dielectric layer;
conductive spacers formed on sidewalls of the first conductive layer and located between an upper surface of the first conductive layer and the first dielectric layer;
a second dielectric layer overlying the first conductive layer and the conductive spacers;
a second conductive layer formed on the second dielectric layer; and
a third conducive layer formed on the second conductive layer;
wherein the third conductive layer of each of the drain and source select gates passes though a portion of the second conductive layer and the second dielectric layer of that select gate so that a portion of the third conductive layer of that select gate contacts the first conductive layer of that select gate, the third conductive layer of that select gate electrically connecting the first and second conductive layers of that select gate, wherein the portion of the third conductive layer of that select gate that contacts the first conductive layer of that select gate is interposed between first and second portions of the second dielectric layer of that select gate;
column access circuitry connected to the bit lines; and
row access circuitry connected to the word lines.

19. The memory device of claim 18, wherein the third conductive layer is a metal-containing layer.

20. The memory device of claim 18, wherein the first conductive layer, the conductive spacers, and the second conductive layer are of polysilicon.

* * * * *

UNITED STATES PATENT AND TRADEMARK OFFICE
CERTIFICATE OF CORRECTION

| | |
|---|---|
| PATENT NO. | : 7,402,861 B2 |
| APPLICATION NO. | : 11/215902 |
| DATED | : July 22, 2008 |
| INVENTOR(S) | : Abbott et al. |

It is certified that error appears in the above-identified patent and that said Letters Patent is hereby corrected as shown below:

On the Title page, in Item (57), under "Abstract", in column 2, line 9, delete "conducive" and insert -- conductive --, therefor.

In column 7, line 49, in Claim 3, delete "sulicides." and insert -- silicides. --, therefor.

In column 8, line 12, in Claim 8, delete "conducive" and insert -- conductive --, therefor.

In column 8, line 51, in Claim 11, delete "conducive" and insert -- conductive --, therefor.

In column 9, line 28, in Claim 15, delete "conducive" and insert -- conductive --, therefor.

In column 9, line 37, in Claim 15, delete "gates," and insert -- gate, --, therefor.

In column 10, line 25, in Claim 18, delete "conducive" and insert -- conductive --, therefor.

Signed and Sealed this

Thirtieth Day of September, 2008

JON W. DUDAS
*Director of the United States Patent and Trademark Office*